United States Patent
Chin

(10) Patent No.: US 8,861,300 B2
(45) Date of Patent: *Oct. 14, 2014

(54) NON-BLOCKING MULTI-PORT MEMORY FORMED FROM SMALLER MULTI-PORT MEMORIES

(75) Inventor: Chung Kuang Chin, Saratoga, CA (US)

(73) Assignee: Infinera Corporation, Sunnyvale, CA (US)

( * ) Notice: Subject to any disclaimer, the term of this patent is extended or adjusted under 35 U.S.C. 154(b) by 488 days.

This patent is subject to a terminal disclaimer.

(21) Appl. No.: 12/495,418

(22) Filed: Jun. 30, 2009

(65) Prior Publication Data

US 2010/0329066 A1    Dec. 30, 2010

(51) Int. Cl.
*G11C 7/02* (2006.01)
*H04L 12/28* (2006.01)
*G11C 7/10* (2006.01)

(52) U.S. Cl.
CPC ............ *G11C 7/1006* (2013.01); *G11C 7/1075* (2013.01); *G11C 7/1012* (2013.01)
USPC ............ 365/230.05; 365/203.02; 365/230.03; 370/389; 370/395.5; 370/412

(58) Field of Classification Search
USPC ...................... 370/357, 363, 389, 395.5, 412; 710/317; 365/230.02, 230.03, 230.05
See application file for complete search history.

(56) References Cited

U.S. PATENT DOCUMENTS

| | | | | |
|---|---|---|---|---|
| 6,480,942 | B1* | 11/2002 | Hirairi | 711/156 |
| 6,556,045 | B2* | 4/2003 | Cohen | 326/46 |
| 6,578,097 | B1* | 6/2003 | Lin et al. | 710/107 |
| 7,009,964 | B2* | 3/2006 | Fisher et al. | 370/363 |
| 2008/0253371 | A1* | 10/2008 | Saxena | 370/390 |
| 2010/0162065 | A1* | 6/2010 | Norman | 714/746 |
| 2010/0189121 | A1* | 7/2010 | Beshai | 370/401 |

* cited by examiner

*Primary Examiner* — Awet Haile
(74) *Attorney, Agent, or Firm* — David L. Soltz

(57) ABSTRACT

A multi-port memory may be formed from a plurality of "simpler" memories. In one implementation, the memory includes a write port and a number of memories provided in groups, such that the write port supplies each of a plurality of copies of the data unit to a subset of the memories, each of the subset of memories being provided in a corresponding one of the groups, a number of the copies of the data unit being greater than two. Multiplexers may be implemented, each of which being associated with a corresponding one of the groups of the memories. One of the plurality of multiplexers may be configured to selectively supply one of the copies of the data unit from one of the memories. A read port may receive the one of the copies of the data unit from the one of the multiplexers and output the one of the copies of the data unit.

21 Claims, 17 Drawing Sheets

NON-BLOCKING MULTI-PORT MEMORY FORMED FROM SMALLER MULTI-PORT MEMORIES

BACKGROUND

Optical networks transmit data over optical fiber. In an optical network, multiplexing protocols such as Synchronous optical networking (SONET) and Synchronous Digital Hierarchy (SDH) may be used to transfer multiple digital bit streams over the same optical fiber. Lasers or light-emitting diodes (LEDs) may used to generate the optical carriers.

Bit streams traversing an optical network may pass through transponder switches. Such a switch may, for example, connect to multiple different fiber ports. Bit streams may be received at the switch, converted to an electrical signal, switched to the appropriate output port based on the electrical signal, converted back to an optical signal, and output as an optical signal on the determined output port.

The switching of an optical signal between ports in the transponder switch may involve the conversion of a serial bit stream into parallel chunks of data that are written to a memory. The data for the bit stream may subsequently be read out of the memory on a path corresponding to the determined output port and converted back to a serial stream. As the bandwidth of the transponder switch increases, the design and layout complexity of the switching circuitry may increase.

SUMMARY

In one implementation, a switch may include an ingress port configured to supply a data unit; a write port coupled to the ingress port, the write port configured to receive the data unit; and a number of memories, provided in groups, such that the write port supplies each of a number of copies of the data unit to a subset of the memories, each of the subsets of memories being provided in a corresponding one of the groups. Further, the switch may include a number of multiplexers, each of which being associated with a corresponding one of the groups of the memories, one of the multiplexers being configured to selectively supply one of the copies of the data unit from one of the memories. A read port may receive of the of copies of the data unit from the one of the multiplexers; and an egress port may be coupled to the read port and configured to output the one of the copies of the data unit.

In another implementation, a storage device may comprise a write port to receive a data unit and a number of memories provided in groups, such that the write port supplies each of a number of copies of the data unit to a subset of the memories, each of the subset of memories being provided in a corresponding one of the groups, a number of the copies of the data unit being greater than two. The storage device may also include a number of multiplexers, each of which being associated with a corresponding one of the groups of the memories, one of the multiplexers being configured to selectively supply one of the copies of the data unit from one of the memories. Further, a read port may be configured to receive said one of the copies of the data unit from said one of the multiplexers and output the one of the copies of the data unit.

In yet another implementation, a memory may include a number of write ports each including an input data line and a write address line; a number of read ports each including an output data line and a read address line; and a number of groups of memories, where the input data line and write address line for each of the write ports are connected to one of the memories in each of the groups of memories, and where the output data line and read address line for each of the read ports are connected to all of the memories in one of the groups of memories.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements.

Implementations, described herein, may provide for a multi-port memory constructed from a number of simpler multi-port memories. In one implementation, the multi-port memory may be implemented as a non-blocking frame buffer in a network switching device.

Exemplary Network

Figure 1:
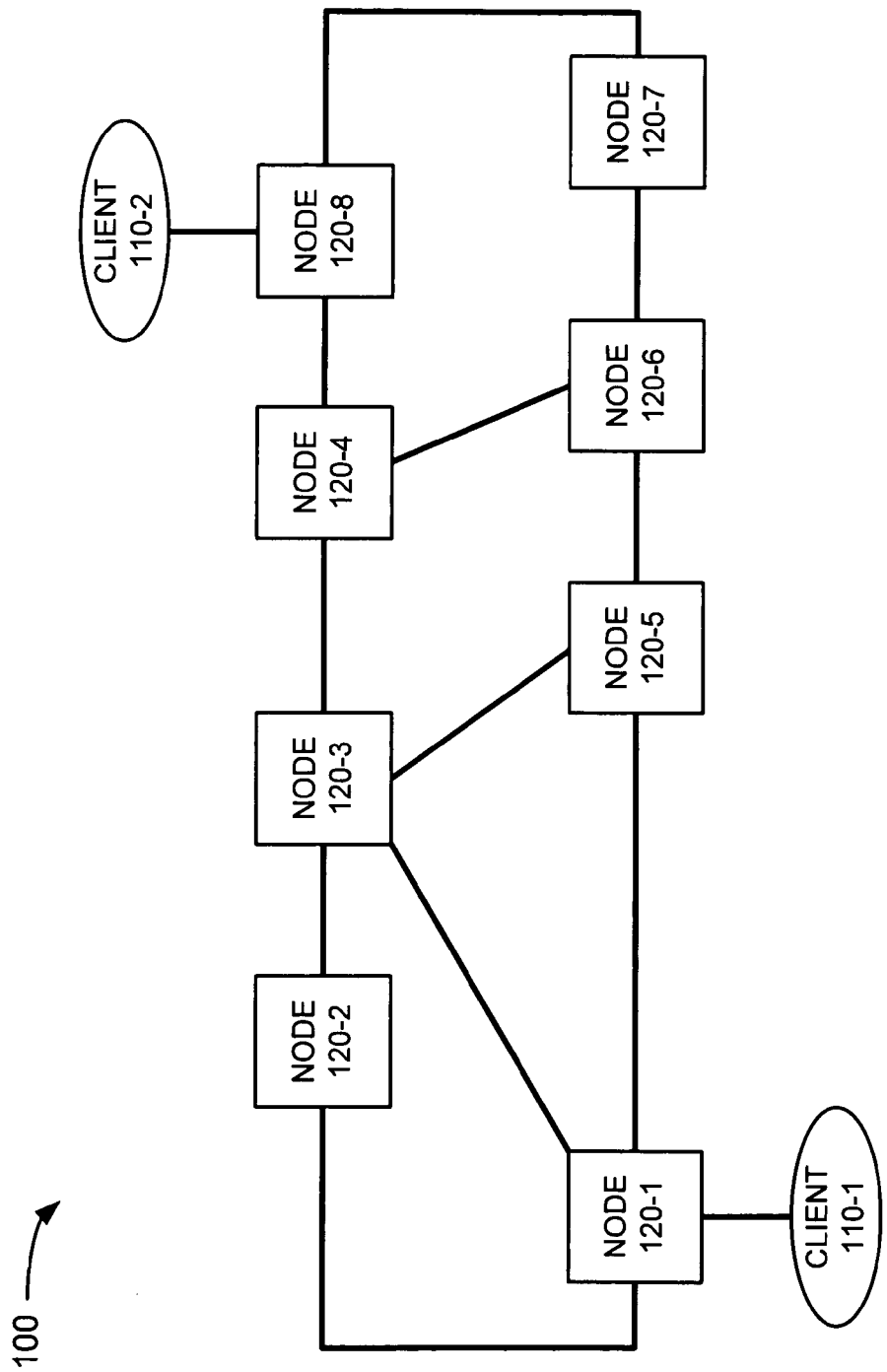
FIG. 1 is a diagram of an exemplary network in which systems and/or methods described herein may be implemented.

FIG. 1 is a diagram of an exemplary network 100 in which systems and/or methods described herein may be implemented. Network 100 may include clients 110-1 and 110-2 (referred to collectively as "clients 110," and generally as "client 110") and nodes 120-1, . . . , 120-8 (referred to collectively as "nodes 120," and generally as "node 120"). While FIG. 1 shows a particular number and arrangement of devices, network 100 may include additional, fewer, different, or differently arranged devices than those illustrated in FIG. 1. Also, the connections between devices may include direct or indirect connections.

Client 110 may include any type of network device, such as a router, a switch, or a central office, that may transmit data traffic. In one implementation, client 110 may transmit a client signal (e.g., a synchronous optical network (SONET) signal, a synchronous digital hierarchy (SDH) signal, an Ethernet signal, or another type of signal) to node 120. The client signal may conform to any payload type, such as Gigabit Ethernet (GbE), 2×GbE, Fibre Channel (FC), 1GFC, 10GbE local area network (LAN) physical layer (Phy), 10GbE wide area network (WAN) Phy, Synchronous Transport Mode 16 (STM-16), STM-64, Optical Carrier level 48 (OC-48), or OC-192.

Nodes 120 may be nodes in an optical network, or an optical portion of a network. Nodes 120 may be connected via optical links. Data traffic may flow from node-to-node over a series of channels/sub-channels forming a path. Any two nodes 120 may connect via multiple optical links. For bidirectional communication, for example, a first optical link may be used for data traffic transmitted in one direction, a second optical link may be used for data traffic transmitted in the opposite direction, and a third optical link may be used in case of a failure on the first link or the second link.

Each node 120 may act as, among other things, an optical switching device in which data is received over an optical link, converted to electrical signals, switched based on the electrical signals, and then output, as an optical signal, to an optical link determined by the switching.

Exemplary Node Components

Figure 2:
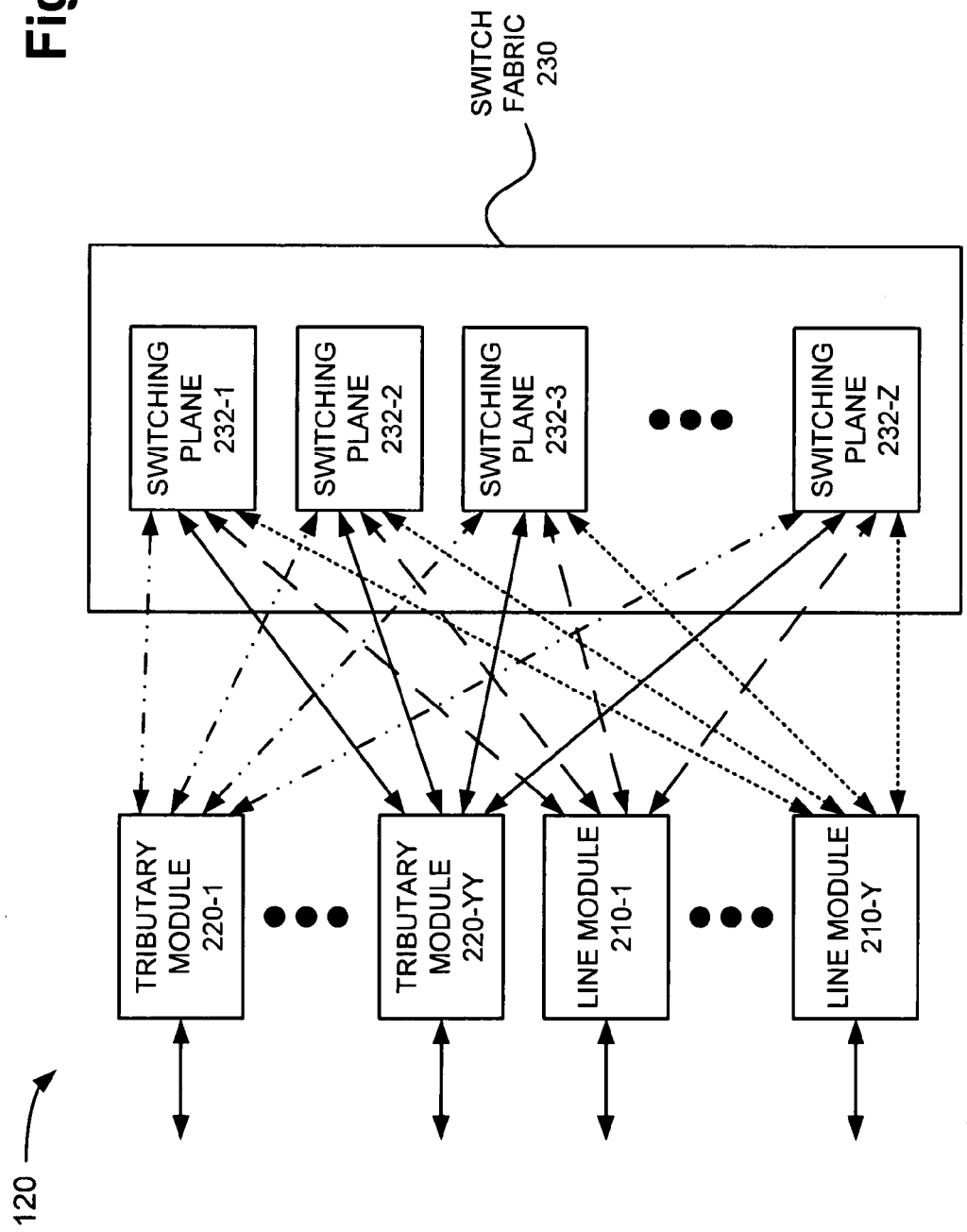
FIG. 2 is a diagram of exemplary components of a node shown in FIG. 1.

FIG. 2 is a diagram of exemplary components of node 120. As shown in FIG. 2, node 120 may include line modules 210-1, . . . , 210-Y (referred to collectively as "line modules 210," and generally as "line module 210") (where Y≥1) and tributary modules 220-1, . . . , 220-YY (referred to collectively as "tributary modules 220," and generally as "tributary module 220") (where YY≥1) connected to a switch fabric 230. As shown in FIG. 2, switch fabric 230 may include switching planes 232-1, 232-2, . . . 232-Z (referred to collectively as "switching planes 232," and generally as "switching plane 232") (where Z≥1). While FIG. 2 shows a particular number and arrangement of components, node 120 may include additional, fewer, different, or differently arranged components than those illustrated in FIG. 2. Also, it may be possible for one of the components of node 120 to perform a function that is described as being performed by another one of the components.

Line module 210 may include hardware components, or a combination of hardware and software components, that may provide network interface operations. Line module 210 may receive a multi-wavelength optical signal and/or transmit a multi-wavelength optical signal. A multi-wavelength optical signal may include a number of optical signals of different optical wavelengths. In one implementation, line module 210 may perform retiming, reshaping, regeneration, time division multiplexing, and/or recoding services for each optical wavelength. Line module 210 may also convert input optical signals into signals represented as electrical signals.

Tributary module 220 may include hardware components, or a combination of hardware and software components, that may support flexible adding-dropping of multiple services, such as SONET/SDH services, GbE services, optical transport network (OTN) services, and FC services. Tributary module 220 may be particularly used to connect nodes 120 to clients 110. Tributary module 220 may also convert input optical signals into signals represented as electrical signals.

Switch fabric 230 may include hardware components, or a combination of hardware and software components, that may provide switching functions to transfer data between line modules 210 and/or tributary modules 220. In one implementation, switch fabric 230 may provide fully non-blocking transfer of data. Each switching plane 232 may be programmed to transfer data from a particular input to a particular output. Switching planes 232 may generally operate by storing data into multi-port digital memories, where data may be read into the digital memories at one port and read out at another port.

As shown in FIG. 2, each of line modules 210 and tributary modules 220 may connect to each of switching planes 232. The connections between line modules 210/tributary modules 220 and switching planes 232 may be bidirectional. While a single connection is shown between a particular line module 210/tributary module 220 and a particular switching plane 232, the connection may include a pair of unidirectional connections (i.e., one in each direction).

Switching Operation of Nodes 120

Figure 3:
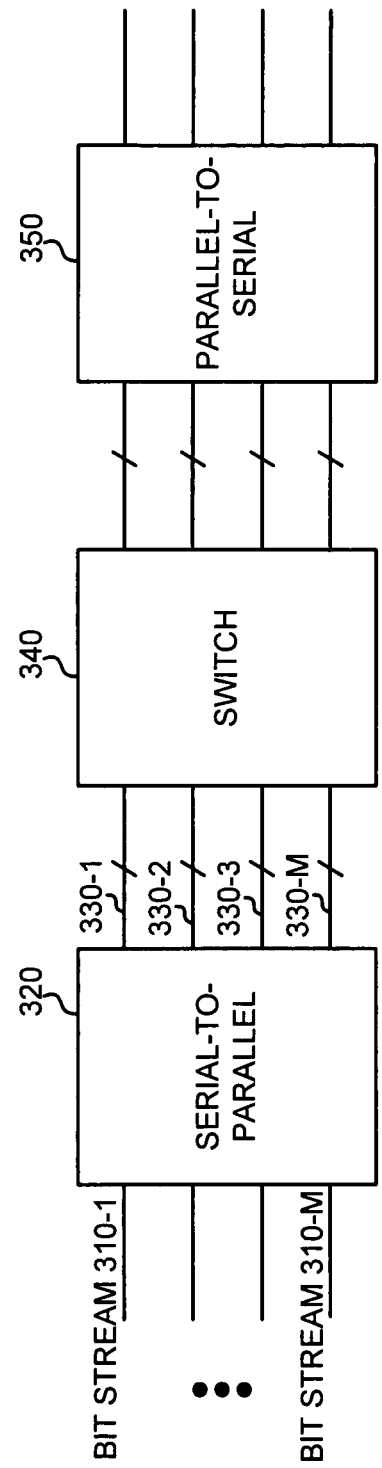
FIG. 3 is a diagram conceptually illustrating switching of data, as performed by components of the node shown in FIG. 2.

FIG. 3 is a diagram conceptually illustrating switching of data, as performed by line modules 210, tributary modules 220, and/or switching fabric 230. As shown, input data may be received as multiple independent serial bit streams 310-1 through 310-M (collectively, streams 310). Each serial bit stream may correspond to a stream received over an optical link. Each serial stream 310 may be converted to a parallel block of data (e.g., a block 20 bits wide) by serial-to-parallel component 320 to produce M output parallel streams 330-1 through 330-M (collectively, streams 310). Each block of data (called a "data unit" herein) in parallel streams 330 may be written to switch 340. Subsequently, each data unit may be read from switch 340 and converted back to its original serial stream by parallel-to-serial component 350. Data may be read at output ports of switch 340 that correspond to the egress path of the stream through node 120. In this manner, input streams may be switched to a desired output path.

In one implementation, switch 340 may be implemented as, for example, a dynamic or static random access memory that includes multiple independent read and write ports. Switch 340 may be designed to be able to simultaneously write input data at write ports and read output data from read ports.

Existing Serial-to-Parallel and Parallel-to-Serial Conversion

Figure 4:
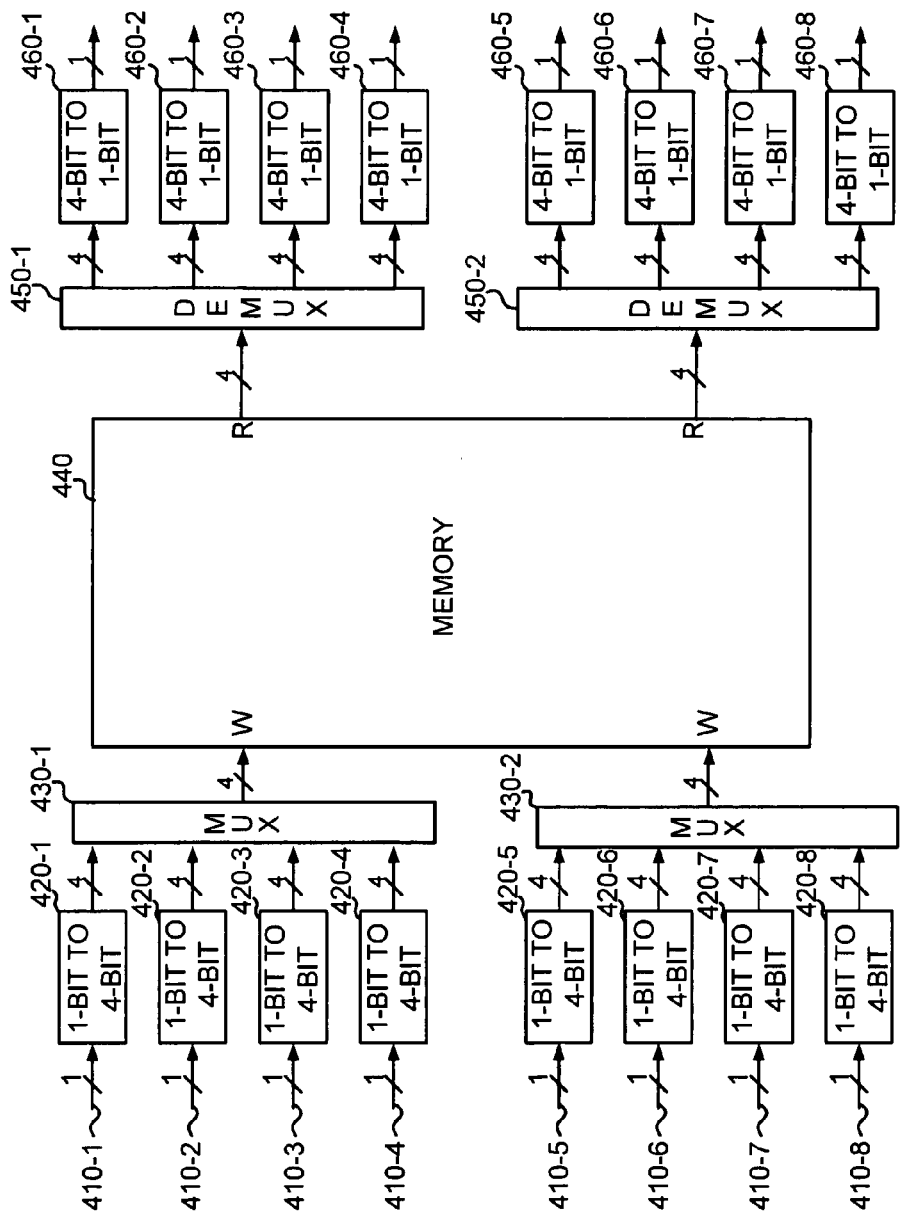
FIG. 4 is a diagram illustrating serial-to-parallel and parallel-to-serial data conversion using an existing technique.

FIG. 4 is a diagram illustrating serial-to-parallel and parallel-to-serial data conversion using an existing technique.

Eight exemplary serial data streams, 410-1 through 410-8 are shown in FIG. 4. Data streams 410 are received by 1-bit to 4-bit conversion circuits 420-1 through 420-8 to create parallel data units corresponding to data streams 410. The parallel data units are received by multiplexers 430-1 and 430-2, which may output, at each clock cycle, four parallel bits from one of streams 410 to memory 440. Memory 440 may be read by the parallel-to-serial portion of the circuit shown in FIG. 4: de-multiplexers 450-1 and 450-2 and 4-bit to 1-bit circuits 460-1 through 460-8.

The operation of the serial-to-parallel portion of the circuit shown in FIG. 4 (1-bit to 4-bit circuits 420 and multiplexers 430) includes receiving input streams 410 at 1-bit to 4-bit circuits 420. Each 1-bit to 4-bit circuit 420 may include four 1-bit registers, which, over four clock cycles, store 4 bits of data per stream. Multiplexers 430-1 and 430-2 may each include a multiplexer that selects one group of four bits from its 16 input lines. Thus, in each of four clock cycles, each of multiplexers 430 may select a different output from one of 1-bit to 4-bit circuits 420 to forward to memory 440.

Figure 5A:
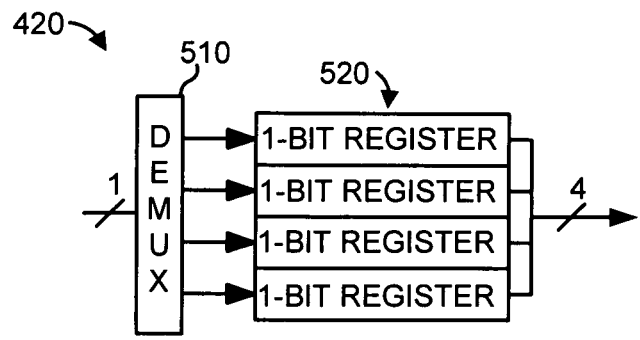
FIG. 5A is a diagram illustrating an exemplary implementation of a 1-bit to 4-bit circuit.

FIG. 5A is a diagram illustrating an implementation of one of 1-bit to 4-bit circuits 420 in additional detail. Circuit 420 may include a de-multiplexer 510 that switches its input bit to one of four 1-bit registers 520. The four bits in 1-bit register 520 may be output by 1-bit to 4-bit circuit 420.

The operation of the parallel-to-serial portion of the circuit shown in FIG. 4 (4-bit to 1-bit circuits 460 and de-multiplexers 450) is similar to the serial-to-parallel portion. Data is output to a particular output stream by reading the data unit (i.e., 4 bits) at the desired output port of memory 440. De-multiplexers 450 may each include a de-multiplexer that receives a 4 bit data unit and outputs the input 4-bits to one of four possible output groups. The data output port to use and the output of de-multiplexer 450 to select may be made based on the desired output stream for the data. The output of de-multiplexer 450 may be stored in 4-bit to 1-bit circuit 460, which may handle the final parallel to serial conversion of the data.

Figure 5B:
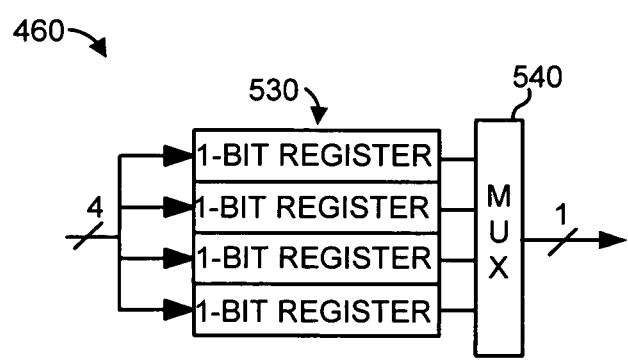
FIG. 5B is a diagram illustrating an exemplary implementation of a 4-bit to 1-bit circuit.

FIG. 5B is a diagram illustrating an implementation of one of the 4-bit to 1-bit circuits 460 in additional detail. Circuit 460 may include four one-bit registers 530 that receive, in parallel, each of the input data bits. Multiplexer 540 may select one of the four registers 530 to forward as an output of circuit 460.

Serial-to-Parallel and Parallel-to-Serial Conversion

Figure 6:
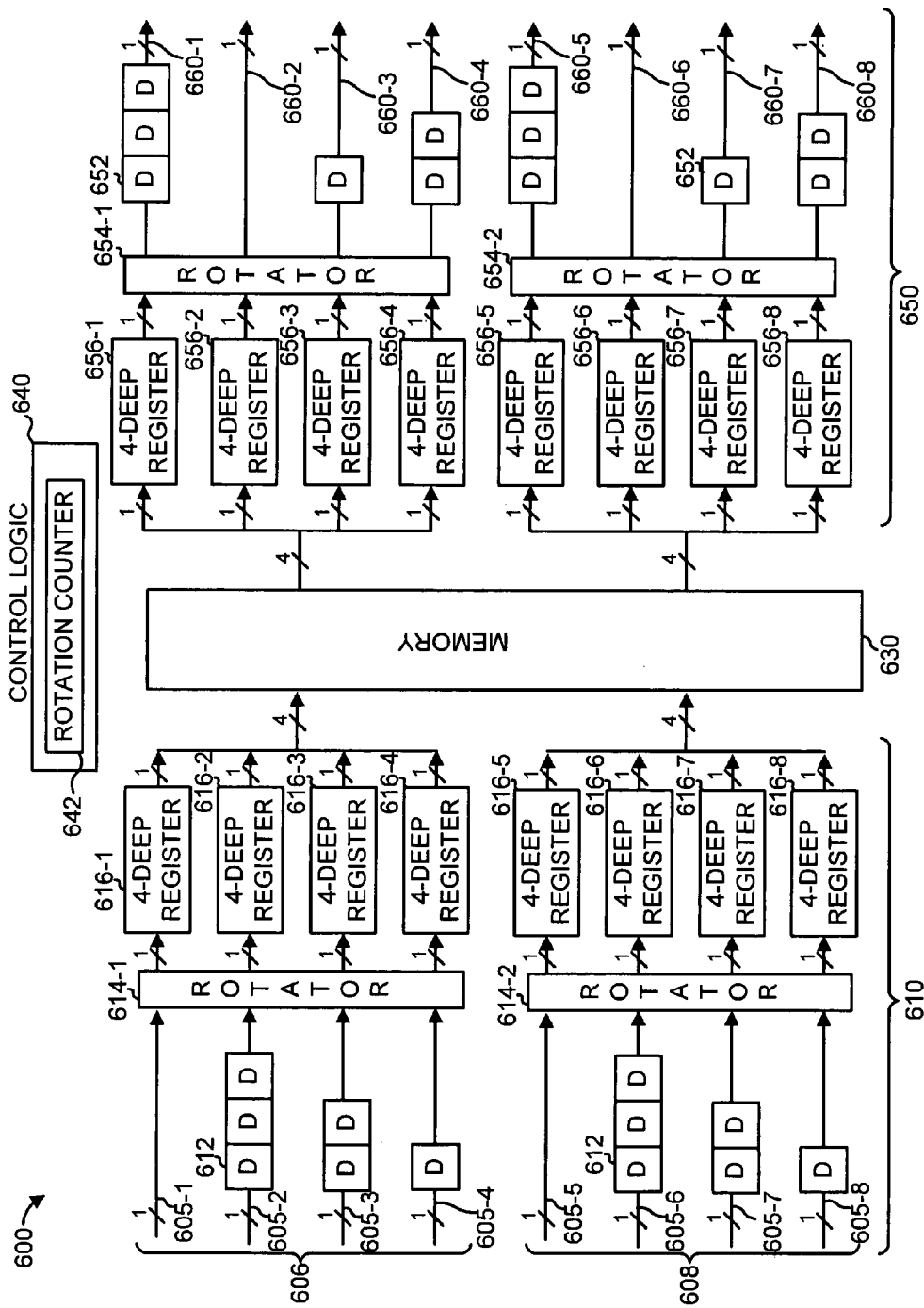
FIG. 6 is a diagram illustrating an exemplary system for switching data.

FIG. 6 is a diagram illustrating an exemplary system 600 for switching data. System 600 may include a serial-to-parallel component 610, a memory 630, control logic 640, and a parallel-to-serial component 650. Serial-to-parallel component 610, memory 630, and parallel-to-serial component 650 are generally arranged as illustrated in FIG. 3. System 600 may receive input data on input serial data streams, labeled as data streams 605-1 through 605-8, and output data on output serial data streams, labeled as output data streams 660-1 through 660-8. Serial-to-parallel component 610, control logic 640, and parallel-to-serial component 650 will now be particularly described.

Control logic 640 may generally provide address and control signals for system 600. For clarity, the address and control lines are not explicitly shown in FIG. 6. Control logic 640 may particularly include rotation counter 642. Rotation counter 642 may be a 2-bit (4 count) counter that may be used to control elements in serial-to-parallel component 610 and parallel-to-serial component 650 by repeatedly incrementing through its count values. In other implementations, in which there are a different number of input data streams 605 or a different bus width to memory 630 is used, the count of rotation counter 642 may be more than two bits.

Serial-to-parallel component 610 may include a number of delay elements 612, rotator components 614-1 and 614-2, and 4-deep register components 616-1 through 616-8. Parallel-to-serial component 650 may include delay elements 652, rotator components 654-1 and 654-2, and 4-deep register components 656-1 through 656-8.

System 600 may operate on a number of incoming serial data streams. Eight data streams 605-1 through 605-8 are shown in FIG. 6. The data streams may be divided into groups such as, as shown for system 600, groups of four data streams 606 and 608 (i.e., data streams 605-1 through 605-4 and 605-5 through 605-8). It can be appreciated that the illustrated number of data streams, the number of data streams per group, and the number of groups are exemplary. In practice, system 600 may include additional or fewer data streams, data streams per group, and number of groups. For example, in one implementation, there may be 200 data streams separated into 10 groups of 20 data streams.

Data streams 605-1 through 605-8 in group 606 may be initially delayed by delay elements 612. Each of delay elements 612 may be implemented as, for example, a capacitive delay element, a digital latch, or another delay element. Each delay element may delay its input one clock cycle. As shown in FIG. 6, data stream 605-1 is not delayed, data stream 605-2 may pass through three delay elements 612 (i.e., three clock cycles), data stream 605-3 may pass through two delay elements 612 (i.e., two clock cycles), and data stream 605-4 may pass through one delay element 612 (i.e., one clock cycle). In this manner, incoming data bits for different data streams are offset from one another when reaching rotator components 614-1. In alternative implementations, the particular arrangement of the different numbers of delay elements corresponding to each data stream 605 may be different.

In general, the implementation and operation of rotator component 614-1 and 4-deep register components 616-1 through 616-4 may be identical to that of rotator component 614-2 and 4-deep register components 616-5 through 616-8. Accordingly, in the description that follows, only the elements associated with group of data streams 606 will be discussed in detail.

Rotator component 614-1 may receive, in each clock cycle, the group of data bits (e.g., 4 bits in the illustrated implementation) from signal lines 605-1 through 605-4. Rotator component 614-1 may generally operate to "rotate" its input based on a rotate count value received from rotation counter 642. In rotating its input, rotator component 614-1 may switch signals on the four input lines to various ones of the four output lines. Which input lines get switched to which output lines may depend on the rotate count value.

Figure 7:
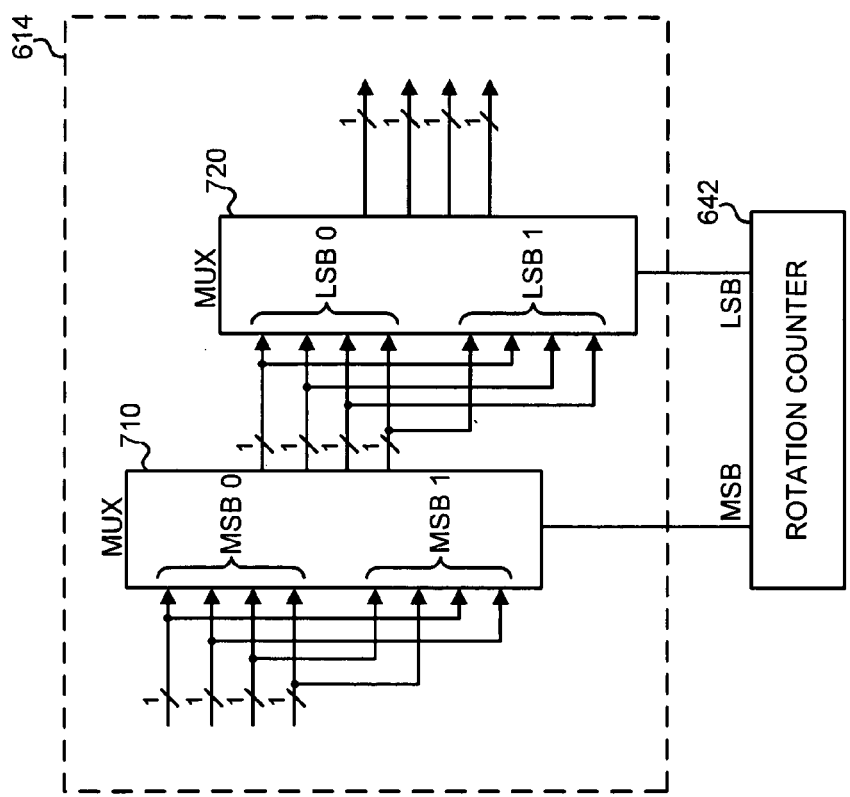
FIG. 7 is a diagram illustrating an exemplary implementation of a rotator component.

FIG. 7 is a diagram illustrating an exemplary implementation of one of rotator components 614. The four input signals received by rotator component 614 may be input to a first multiplexer 710. The output of first multiplexer 710 may be output to second multiplexer 720. Multiplexers 710 and 720 may each be eight input, four output (8:4) multiplexers. Multiplexers 710 and 720 may each receive the eight inputs, replicated into two groups of four, and output four signals (one of the two groups) based on an input control line. The input control line for multiplexer 710 may be the most significant bit (MSB) of the two-bit output of rotation counter 642 and the input control line for multiplexer 720 may be the least significant bit (LSB) of the two-bit output of rotation counter 642. In one implementation, multiplexers 710 and 720 may be implemented using eight separate 2:1 multiplexers (e.g., controlled switches).

More generally, in implementations in which the group of data streams 606 includes N data streams, rotator component 614 may receive the N inputs and implement the rotation operation using two 2*N input, N output multiplexers.

Table I, below, illustrates a rotation operation as performed by rotator component 614. In Table I, assume the input signals (data bits) to rotator component 614 are labeled "n", "p", "r", and "v". The output, rotated signals, for each of the four rotation count values are shown in the table. For example, when the rotation count equals two (i.e., MSB=1 and LSB=0), the output data bits would be rearranged into the order "r", "v", "n", "p". As can be observed in Table I, over the course of the rotation count, the signal at any particular input location is switched to be output once at each of the output locations (i.e., the input at "n" is variously output at "n", "v", "r", and "p"; the input at "p" is variously output at "p", "n", "v" and "r", etc.).

TABLE I

| | ROTATION COUNT | | | |
|---|---|---|---|---|
| Inputs | 0<br>MSB = 0,<br>LSB = 0 | 1<br>MSB = 0,<br>LSB = 1 | 2<br>MSB = 1,<br>LSB = 0 | 3<br>MSB = 1,<br>LSB = 1 |
| n | n | p | r | v |
| p | p | r | v | n |
| r | r | v | n | p |
| v | v | n | p | r |

As a further example of a rotation operation performed by rotator component 614, consider four data bits labeled as bits "a", "b", "c", and "d" and received at the four input lines of rotation component 614. Assume that the rotation count is zero (MSB=0, LSB=0). When MSB=0, the output of multiplexer 710 is the same as its input, so the output of multiplexer 710 may be the four data bits in their original order (i.e., "a", "b", "c", and "d"). When LSB=0, the output of multiplexer 720 is the same as its input, so the output of multiplexer 720, and hence the output of rotator component 614, may still be the four data bits in their original order (i.e., "a", "b", "c", and "d"). Now assume that the rotation count is one (MSB=0, LSB=1). When MSB=0, the output of multiplexer 710 is the same as its input, so the output of multiplexer 710 may be the four data bits in their original order (i.e., "a", "b", "c", and "d"). When LSB=0, the output of multiplexer 720 is a rearranged version of its input in which the first value input is shifted to the last value, the second input value is shifted to first output, the third value input is shifted to second output, and the fourth value input is shifted to third output. Accordingly, the output of multiplexer 720, and hence the output of rotator component 614, may be the four data bits "b", "c", "d", and "a".

Returning to FIG. 6, 4-deep register components 616-1 through 616-4 may receive the values output from rotator component 614-1. Each of 4-deep register components 616-1 through 616-4 may include four registers to store four parallel bits. At each clock cycle, each 4-deep register component 616-1 through 616-4 may output one bit, providing, in total, a four-bit data unit to memory 630. The four-bit data unit represents four parallel bits from one of input signal lines 605.

Figure 8:
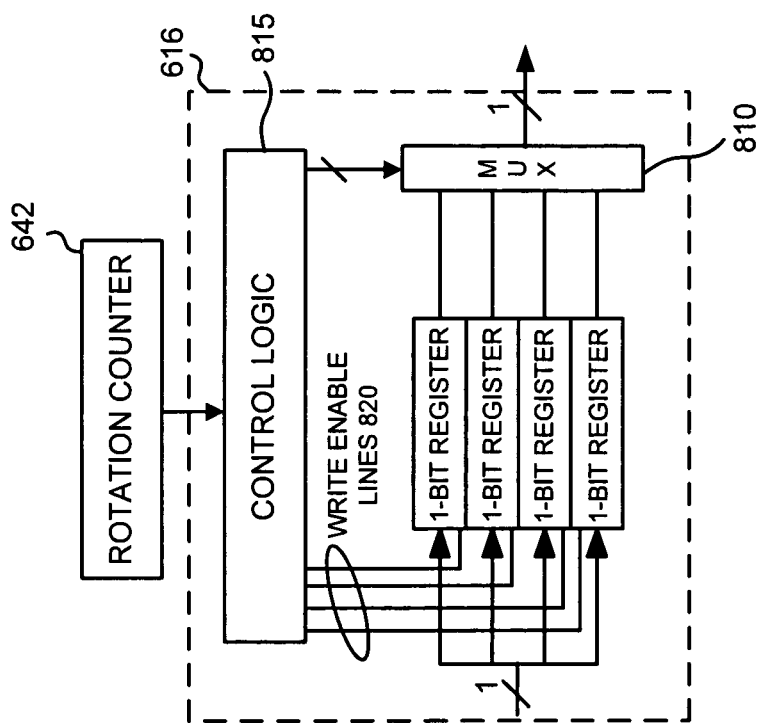
FIG. 8 is a diagram illustrating an exemplary implementation of a 4-deep register component.

FIG. 8 is a diagram illustrating an exemplary implementation of one of 4-deep register components 616. As shown, 4-deep register component 616 may include four 1-bit registers 805, each connected to one of the input signal lines and a multiplexer 810. Multiplexer 810 may include a 4:1 multiplexer that selects one of the outputs of the 1-bit registers 805 to output. 1-bit registers 805 and multiplexer 810 may be controlled by control logic 815 based on the output of rotation counter 642. In particular, control logic 815 may, in each clock cycle, enable one of 1-bit registers 805 to write its input data bit. Control logic 815 may simultaneously control multiplexer 810 to select the output of another of 1-bit registers 805 to output from 4-deep register component 616.

Referring back to FIG. 6, control logic 815 in 4-deep registers 616-1 through 616-4, may collectively control 4-deep registers 616-1 through 616-4 to simultaneously output the bits of a four-bit data unit, corresponding to four sequentially received bits on one of signal lines 605-1 through 605-4. The data unit may be stored in memory 630 at an address set by control logic 640.

In alternative implementations, 4-deep register components 616 may include additional or fewer 1-bit registers 805. For example, the number of 1-bit registers may be equal to the memory bus width to memory 630.

Parallel-to-serial component 650 generally operates to "reverse" the parallelization performed by parallel-to-serial component 610. The output of parallel-to-serial component 650, output data streams 660-1 through 660-8, may be a time-delayed version of input data streams 605-1 through 605-8. Parallel-to-serial component 650 may receive the parallel 4-bit data units from memory 630. In one implementation, the port of memory 630 from which a data unit is read may be controlled by control logic 640. Control logic 640 may additionally control 4-deep registers 656 and rotator component 654 to sequentially output the data units on one of the output signal lines.

A data unit read from memory 630 may be input to the 4-deep registers corresponding to the output signal line. As shown in system 600, for example, each of 4-deep registers 656-1 through 656-4 may receive one of the four bits in the data unit. Each of 4-deep registers 656-1 through 656-4 may also output one of its stored bits. The outputs may be rotated by rotator component 654-1 and delayed by delay elements 652.

As with delay elements 612, each of delay elements 652 may be implemented as, for example, a capacitive delay element, a digital latch, or another delay element. Each delay element 652 may delay its input one clock cycle. As shown in FIG. 6, output data stream 660-1 may pass through three delay elements 652 (i.e., delayed three clock cycles), output data stream 660-2 is not delayed, output data stream 660-3 may pass through one delay element 652 (i.e., one clock cycle), and output data stream 660-4 may pass through two delay element 652 (i.e., two clock cycles).

Rotator components 654 and 4-deep register components 656 may be constructed identically to rotator components 614 and 4-deep register components 616, respectively, and as shown in FIGS. 7 and 8.

Figure 9:
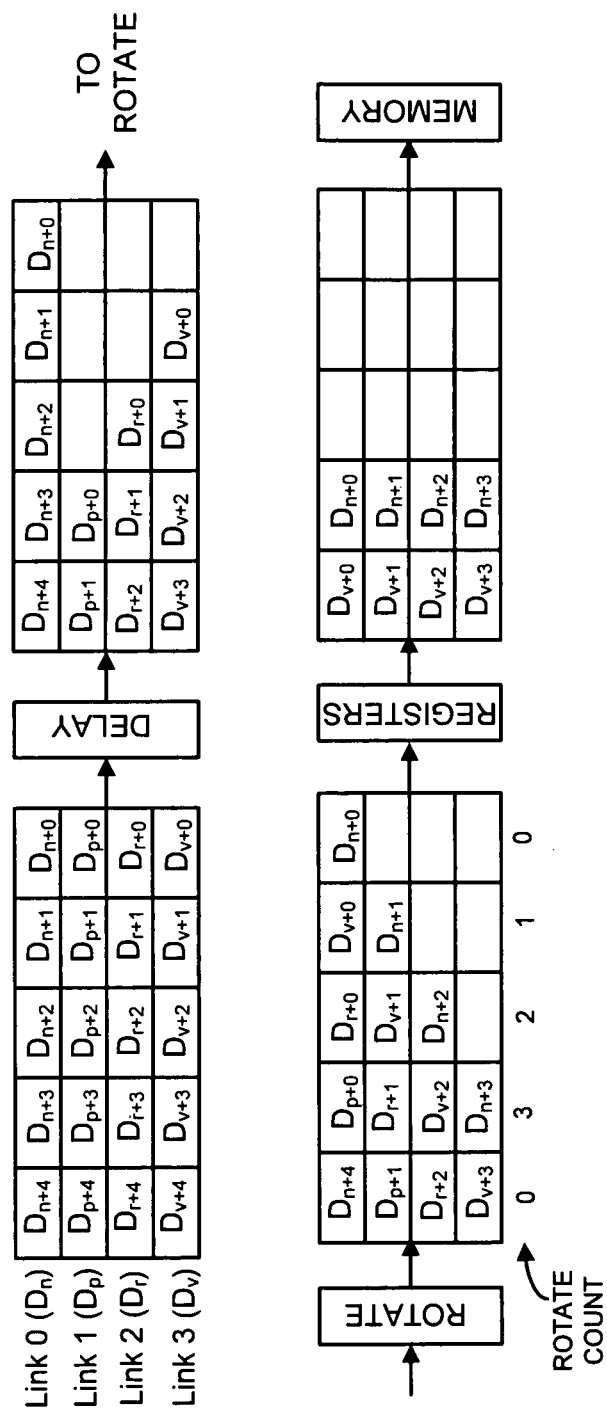
FIG. 9 is a timing diagram illustrating exemplary operation of a serial-to-parallel component.

FIG. 9 is a timing diagram illustrating exemplary operation of serial-to-parallel component 610. Four serial input signals, corresponding to input signals 605-1 through 605-4 are illustrated in FIG. 9: data signal $D_n$ (received on Link 0), data signal $D_p$ (received on Link 1), data signal $D_r$ (received on Link 2), and data signal $D_v$ (received on Link 3). A number of serial bits may be received over each link. For data signal $D_n$, for example, the first received bit is shown as $D_{n+0}$, the second received bit is shown as $D_{n+1}$, etc. Similar notation is used for data signals $D_p$, $D_r$, and $D_v$. In the timing boxes shown in FIG. 9, relative timing relationships of the data signals are shown as the signal progresses through serial-to-parallel component 610.

After processing by delay elements 612 ("DELAY"), the data signals will be staggered. $D_n$, which is not delayed, is unchanged, while signal $D_v$, for example, is delayed one clock cycle. Signals $D_p$ and $D_r$ are correspondingly delayed three clock cycles and two clock cycles, respectively.

After processing by rotator 614 ("ROTATE"), the data signal timings may be rearranged as shown. As can be seen, after rotation, each four-bit group of bits for a particular sample (e.g., $D_{n+0}$, $D_{n+1}$, $D_{n+2}$, and $D_{n+3}$) are placed on different paths. Because of this, a different 4-deep register 616-1 through 616-4 may receive each bit of the data group.

After processing by 4-deep registers 616 ("REGISTERS"), the data signals may be further arranged as shown, in which four successive bits of a particular data signal are arranged in parallel with one another. These parallel data units may then be written to memory 630 as a single data unit.

Figure 10:
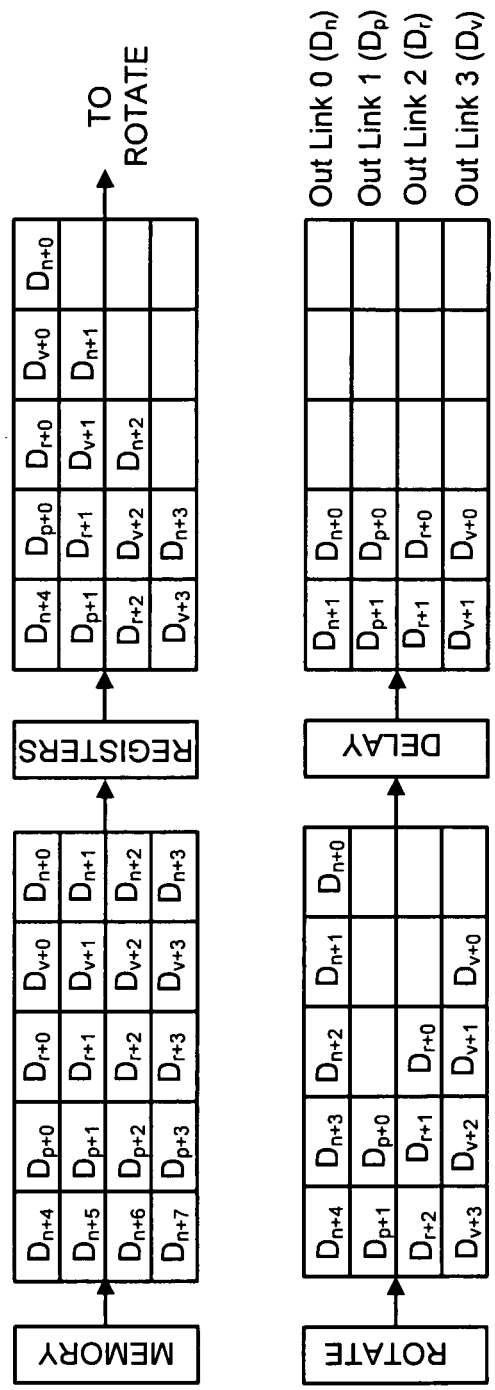
FIG. 10 is a timing diagram illustrating exemplary operation of a parallel-to-serial component.

FIG. 10 is a timing diagram illustrating exemplary operation of parallel-to-serial component 650. As shown, the signals may be output from memory 630 as parallel units of data. After processing by 4-deep registers 656 ("REGISTERS"), the data signals may be staggered as shown. Rotator 654 ("ROTATE") may rotate the staggered signals to re-serialize the signals. The serialized signals may then be delayed by delay elements 652 ("DELAY") to establish the original relative timing between the bits in different signals.

Serial-to-parallel component 610 and parallel-to-serial component 620 may efficiently perform serial-to-parallel and parallel-to-serial conversion. For instance, in existing serial-to-parallel systems, such as the one shown in FIG. 4, multiplexers 430 may each be multiplexers that have a number of inputs equal to the memory width times the number of input streams. This can result in a relatively large number of signal lines and a complicated circuit layout. In contrast, with multiplexers 710 and 720, for instance, a reduced number of inputs are needed (e.g., twice the memory width).

In general, the parallel data units output by serial-to-parallel component 610 and the serial data streams output by parallel-to-serial component 650 may be used in any application that requires parallel/serial conversion. The switch shown in system 600 is one exemplary application.

Memory

Memory 630 may be a multi-port memory that acts as a frame buffer in a switch. As a frame buffer, memory 630 may store data units for a complete frame before the frame is read out of memory 630. In other implementations, memory 630 may be a multi-port memory used in the context of other applications.

Figure 11:
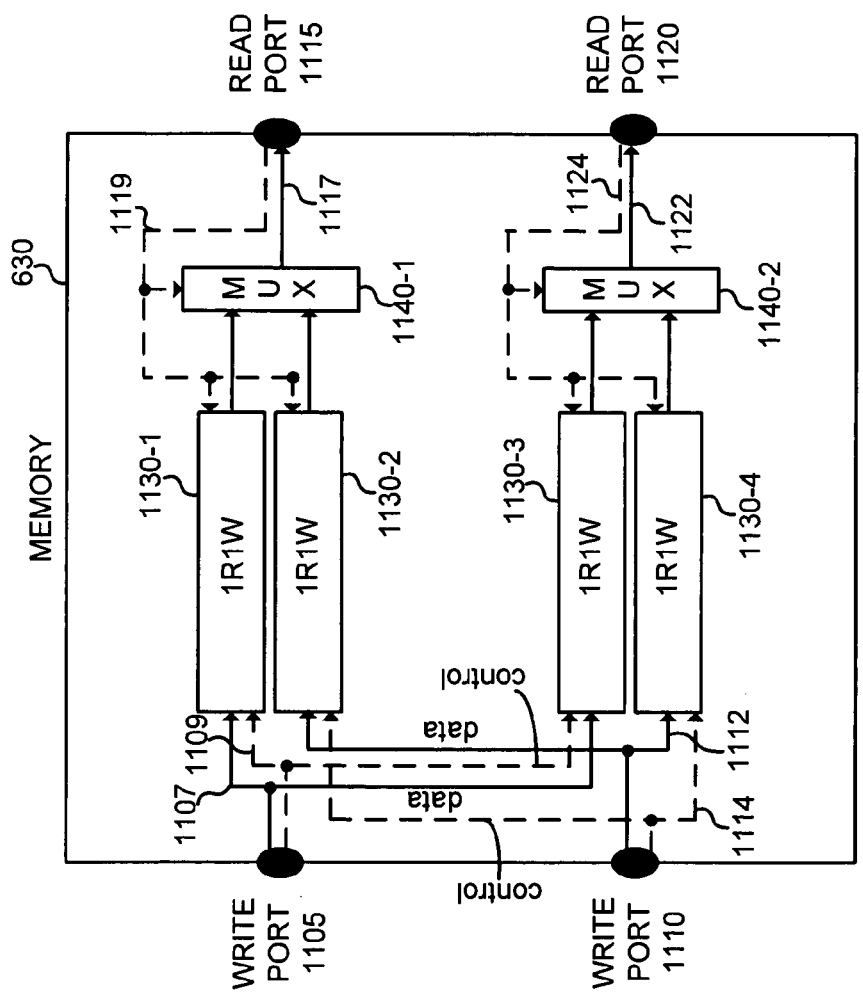
FIG. 11 is a diagram illustrating an exemplary implementation of a memory.

FIG. 11 is a diagram illustrating an exemplary implementation of memory 630. Memory 630 may include two write ports 1105 and 1110, and two read ports 1115 and 1120. Each of write ports 1105 and 1110 may act as an independent port through which data units can be written to memory 630. During a write cycle, both ports 1105 and 1110 (or one of ports 1105 or 1110) can be used to independently write data units to memory 630. That is, a first data unit may be written to memory 630 through port 1105 and a second data unit may be written to memory 630 through port 1110.

Data lines and control lines may be associated with each port of memory 630. Data lines are shown in FIG. 11 as solid lines and control lines are shown as dashed lines. Write port 1105, for instance, is associated with data lines 1107 and control lines 1109. Data lines 1107 may include a number of lines equal to the width of the memory port. In system 600, for example, each write port may include four data lines. Control lines 1109 may include address lines used to receive the address at which the data is written and a write enable line used to control when writing is enabled. Write port 1110 may include a similar set of data lines 1112 and control lines 1114.

Read ports 1115 and 1120 may also be associated with data and control lines. For read port 1115, the output data units may be transmitted over data lines 1117. Input control lines 1119 may be used to provide a read address and a read enable signal. Similarly, for read port 1120, the output data units may be transmitted over data lines 1122. Input control lines 1124 may be used to provide the read address and a read enable signal.

Signals on the control lines for the read and write ports may be generated by control logic 640.

Multi-port memory 630 may include a number of one-read-one-write (1R1W) memories 1130-1 through 1130-4. Memories 1130 may be thought of as being logically grouped (groups 1130-1, 1130-2; and 1130-3, 1130-4) into a number of groups equal to the number of write ports or read ports. For the memories within a group, each write port may write to one memory in the group and all the memories in a group may be read by a single read port. With this construction, any read port may read the data written at any of the write ports. This may be a particularly useful feature for a non-blocking switch, in which data units may be written at any write port and read out at any read port.

One-read-one-write memories are generally known in the art and may be typically available in standard circuit design libraries. In a 1R1W memory, a data unit may be written to the memory at one address while another data unit may be simultaneously read from the memory at another address.

Memory 630 may also include multiplexers 1140-1 and 1140-2. Multiplexer 1140-1 may receive a data unit output from 1R1W 1130-1 and a data unit output from 1R1W 1130-2. Multiplexer 1140-1 may select one of the data units, based on a signal from control line 1119, to output at read port 1115. Multiplexer 1140-2 may receive a data unit output from 1R1W 1130-3 and a data unit output from 1R1W 1130-4. Multiplexer 1140-2 may select one of the data units, based on a signal from control line 1124, to output at read port 1120.

In the operation of memory 630, data units may be received at write ports 1105 and 1110. Each data unit received at write port 1105 may be written to the same address in two 1R1W memories: 1R1W 1130-1 and 1R1W 1130-3. Similarly, each data unit received at write port 1115 may be written to the same address in two 1R1W memories: 1R1W 1130-2 and 1R1W 1130-4.

Concurrently with the writing of data units to memory 630, data units may be read at read ports 1115 and 1120. An address received at read port 1115 may be applied to both of memories 1130-1 and 1130-2. The address may be further used to control multiplexer 1140-1 to select one of the data units. Similarly, an address received at read port 1120 may be applied to both of memories 1130-3 and 1130-4. The address may be further used to control multiplexer 1140-2 to select one of the data units.

With memory 630, multiple 1R1W memories can be used to construct a multi-port memory. In the example of FIG. 6, a 2R2W memory is implemented using four 1R1W memories.

Although memory 630 is shown in FIG. 11 as a 2R2W memory, in alternative implementations, memory with additional ports may be constructed. In general, for memory 630, the number of 1R1W memory groups and the number of 1R1W memories in each group may be equal to the number of write or read ports. Additionally, one multiplexer may be used for each group to connect one of the 1R1W memories in a group to the output port.

Figure 12:
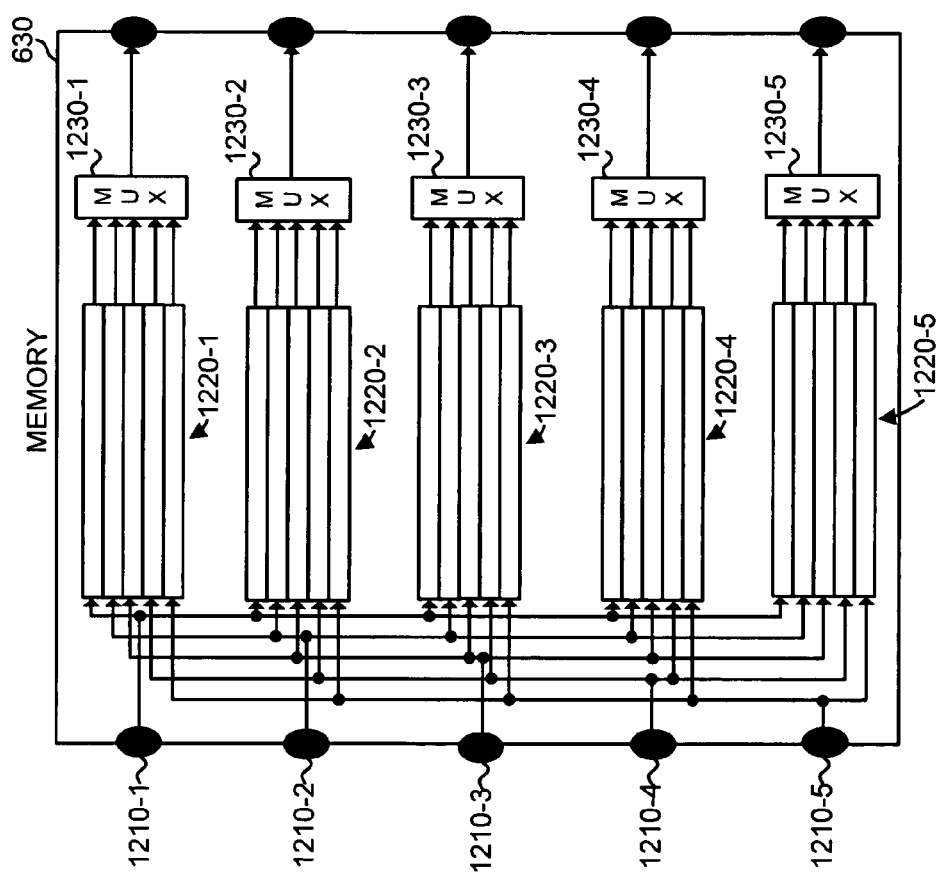
FIG. 12 is a diagram illustrating another implementation of a memory.

FIG. 12 is a diagram illustrating another implementation of memory 630, in which memory 630 implements a 5R5W memory. Five write ports 1210-1 through 1210-5 may connect to five 1R1W memory groups 1220-1 through 1220-5. For clarity, only data paths are shown in FIG. 12. Each memory group 1220 may include five 1R1W memories. Each memory in each memory group 1220 may connect to a corresponding multiplexer 1230-1 through 1230-5.

In one implementation, the memory width of the 1R1W memories may be 10 bits (i.e., the data unit size is 10 bits) and each of the 1R1W memories may include approximately 1600 addressable data units.

Multi-port memory 630, as described above, was constructed from a number of standard "building block" 1R1W memories. The concepts discussed with respect to FIGS. 11 and 12 may be similarly applied to form multi-port non-blocking memories in which multi-port building block memories are used to create a multi-port memory with a greater number of ports than the building block multi-port memories.

Figure 13:
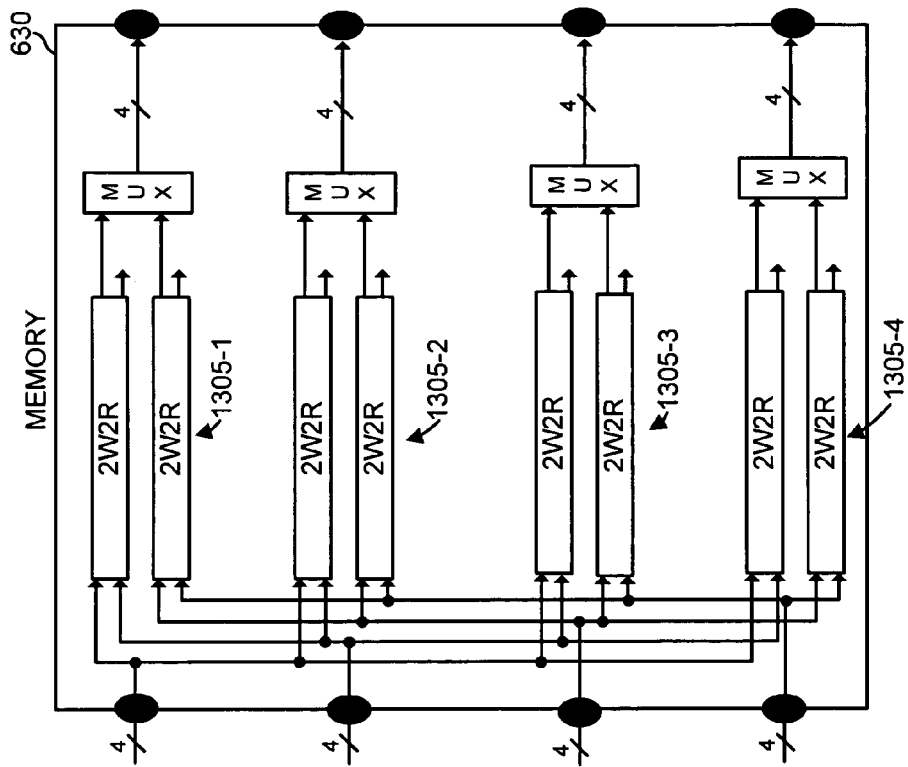
FIG. 13 is a diagram illustrating another implementation of a memory.

FIG. 13 is a diagram illustrating an exemplary implementation of memory 630 in which eight two-write-two-read (2W2R) memories are used to create a four-write-four-read (4W4R) multi-port memory. Four memory groups 1305-1 through 1305-4, each including two 2W2R memories may be used. Each input port may write to a 2W2R memory in each group 1305. Because each 2W2R memory includes two write ports, two input ports may write to each 2W2R memory. Similarly, at the output of each group 1305, up to two data units may be read from each 2W2R memory, resulting in up to four data units being input to each multiplexer, which may select one of the up to four input data units to output to its corresponding output port. In the implementation show, only one read port of each 2W2R memories is used, resulting in an implementation in which each multiplexer selects one of its two input data units.

Alternative Implementations of Switch 340

Switch 340 was generally described above as a multi-port memory that is used with the serial-to-parallel and parallel-to-serial components. In alternative implementations, switch 340 may be implemented differently. FIGS. 14-17 are diagrams illustrating exemplary alternative implementations of switch 340. In these diagrams, serial-to-parallel components 1410 and parallel-to-serial components 1420 are shown interacting with a switch 1415. Each serial-to-parallel component 1410 may correspond to, as shown in FIG. 6, delay elements 612, rotator 614-1, and 4-deep register components 616-1 through 616-4. Similarly, each parallel-to-serial component 1420 may correspond to, as shown in FIG. 6, 4-deep register components 656-1 through 656-4, rotator 654-1, and delay elements 652.

Figure 14:
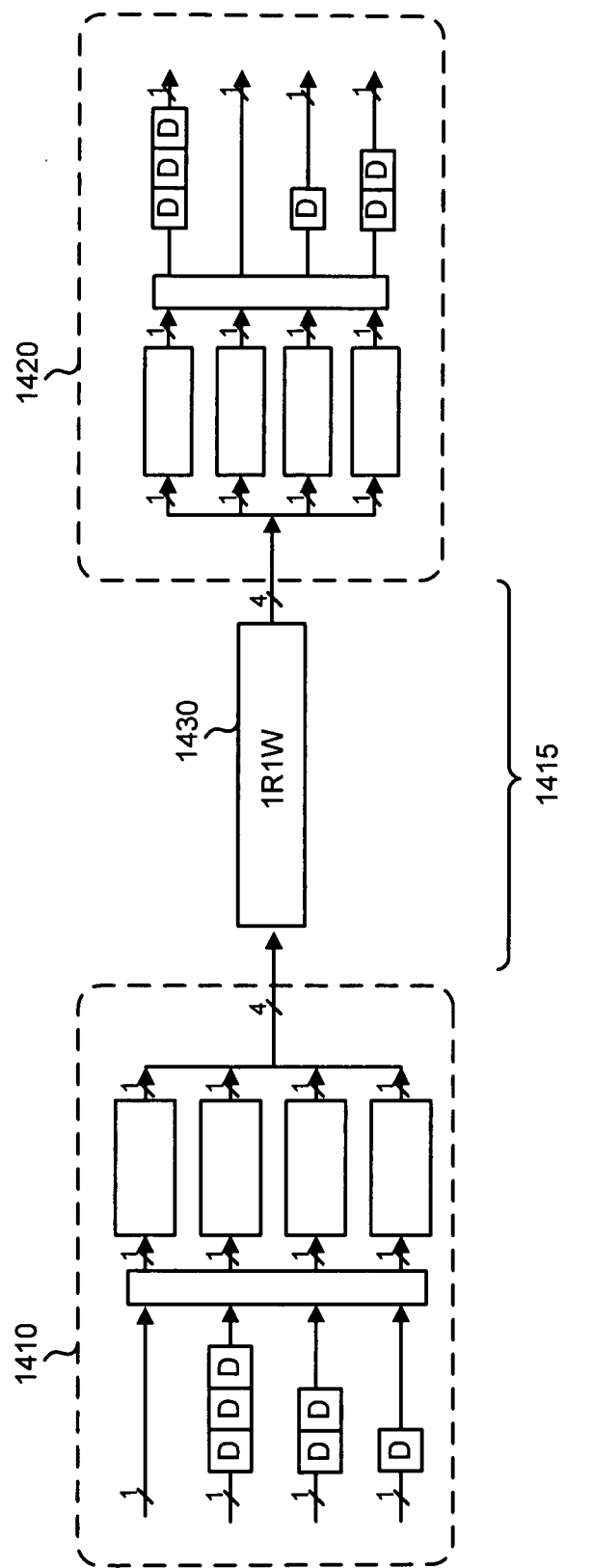
FIG. 14 is a diagram illustrating an first exemplary alternative implementation of a switch.

As shown in FIG. 14, switch 1415 may include a single 1R1W memory 1430. In this example, 1R1W memory 1430 may function as a simple buffer memory.

Figure 15:
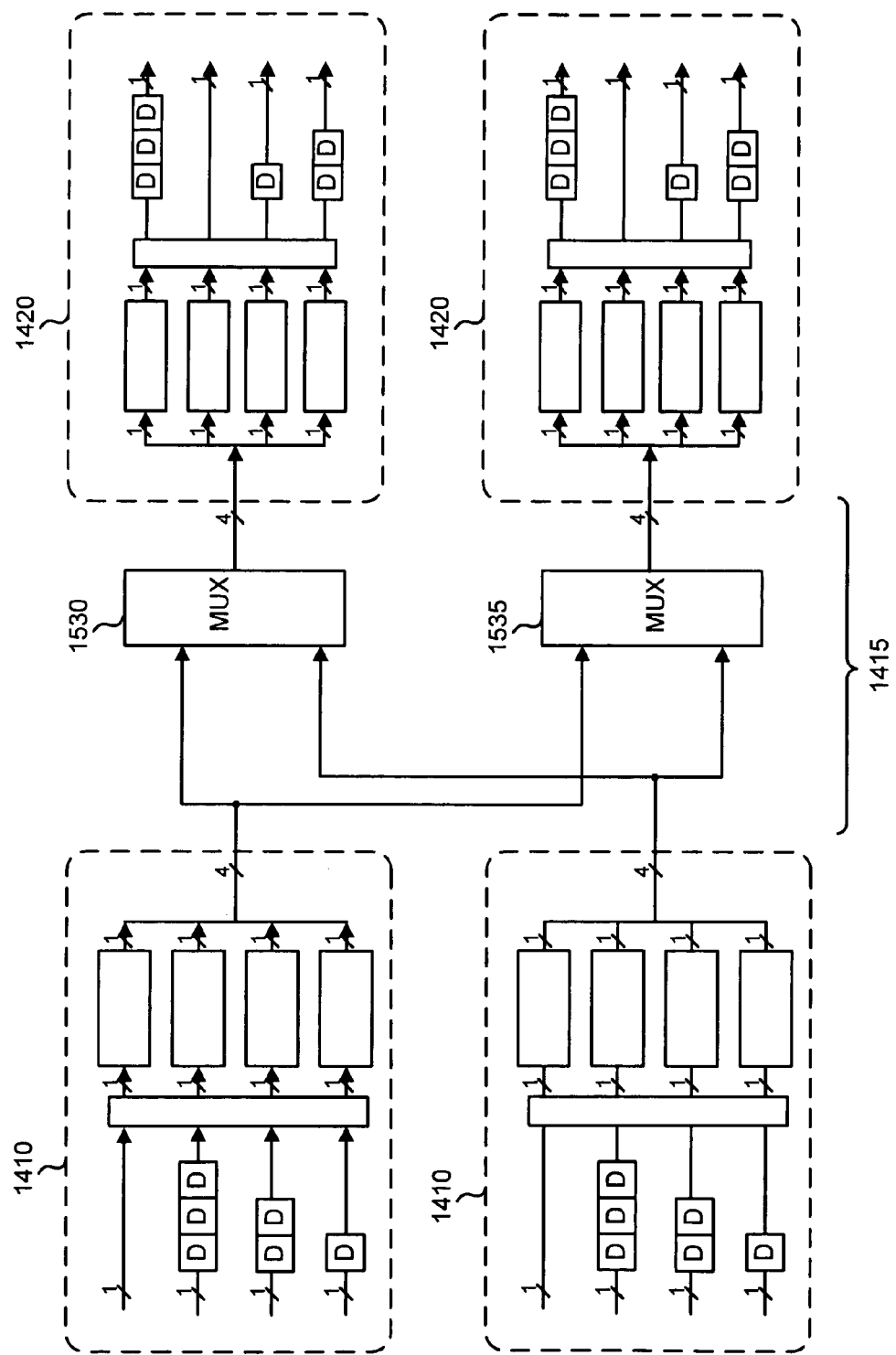
FIG. 15 is a diagram illustrating a second exemplary alternative implementation of a switch.

As shown in FIG. 15, switch 1415 may be implemented as a pair of multiplexers 1530 and 1535. With multiplexers 1530 and 1535, parallel data units output from serial-to-parallel components 1410 may be selectively switched to one of parallel-to-serial components 1420.

Figure 16:
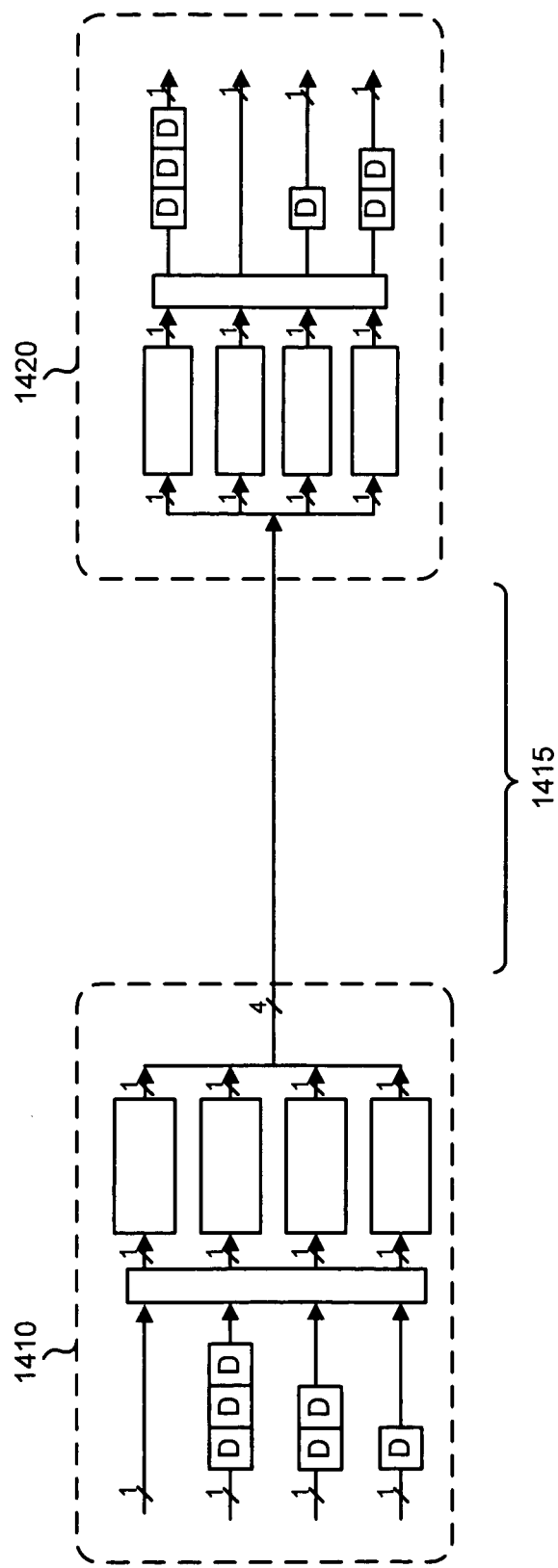
FIG. 16 is a diagram illustrating a third exemplary alternative implementation of a switch.

As shown in FIG. 16, switch 1415 may be implemented as a simple pass through bus. Here, the rotators within serial-to-parallel component 1410 and parallel-to-serial component 1420 may be used to switch the input serial data streams to different corresponding output serial data streams.

Figure 17:
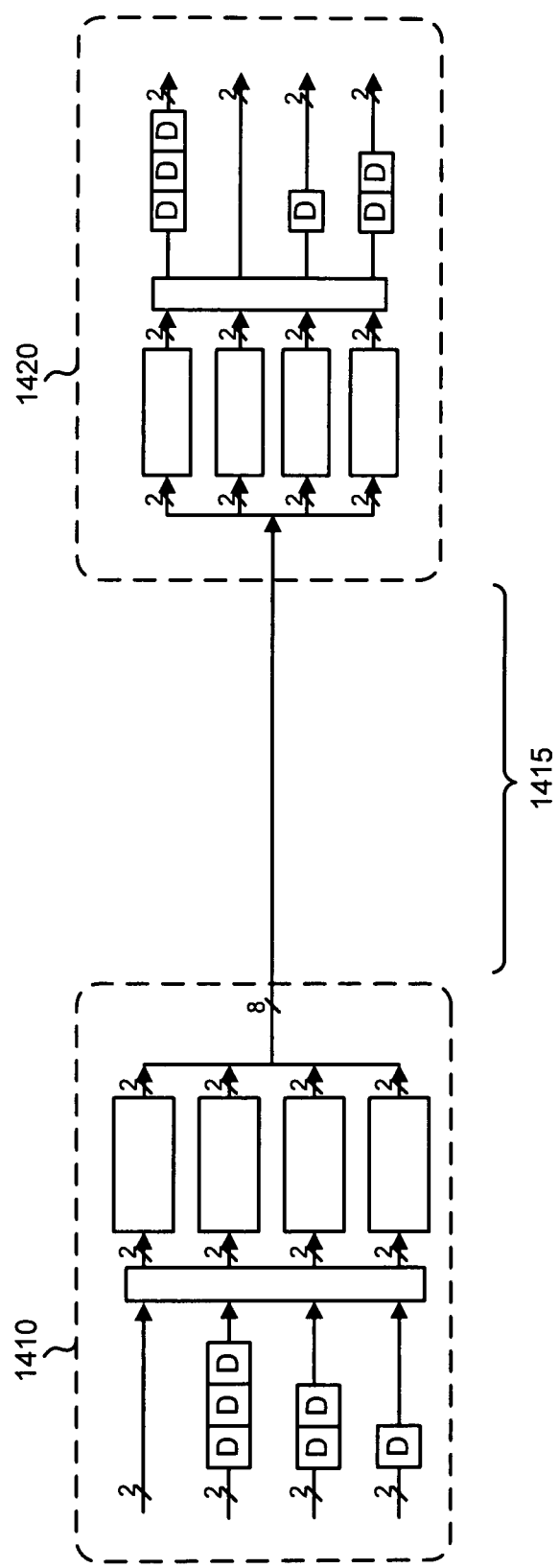
FIG. 17 is a diagram illustrating a fourth exemplary alternative implementation of a switch.

As shown in FIG. 17, switch 1415 may be implemented as a simple pass through bus. The switching may be accomplished by configuration of the pass through bus. In this example, each input and output serial stream is shown as a two-bit wide serial stream, creating a 4-bit wide switch bus width. Equivalently, this can be conceptualized as two parallel one-bit wide implementations, such as is shown in FIG. 16.

CONCLUSION

The foregoing description provides illustration and description, but is not intended to be exhaustive or to limit the invention to the precise form disclosed. Modifications and variations are possible in light of the above teachings or may be acquired from practice of the invention.

Also, certain portions of the implementations have been described as "components" that perform one or more functions. The term "component," may include hardware, such as a processor, an application specific integrated circuit (ASIC), or a field programmable gate array (FPGA), or a combination of hardware and software.

Further, while implementations have been described in the context of an optical network, this need not be the case. These implementations may apply to any form of circuit-switching network.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "tone" or similar language is used. Further, the phrase "based on" is intended to mean "based, at least in part, on" unless explicitly stated otherwise.

What is claimed is:

1. A switch, comprising:
a first rotator circuit having a plurality of inputs and a plurality of outputs, the rotator circuit rotates a signal present on one of the plurality inputs among each of a plurality of outputs in accordance with a first rotation count;
a first register coupled to one of the plurality of outputs of the first rotator circuit;
an ingress port configured to supply a data unit from the first register;
a write port coupled to the ingress port, the write port configured to receive the data unit;
a plurality of memories provided in groups, the write port supplies each of a plurality of copies of the data unit, such that said each of the plurality of copies of the data unit is written to a subset of the plurality of memories, each of the subsets of the plurality of memories being provided in a corresponding one of the plurality of groups;
a plurality of multiplexers, each of which being associated with a corresponding one of the groups of the memories, one of the plurality of multiplexers being configured to selectively supply one of the plurality of copies of the data unit from one of the plurality of memories;
a read port configured to receive said one of the plurality of copies of the data unit from said one of the plurality of multiplexers;
an egress port coupled to the read port and configured to output said one of the plurality of copies of the data unit;
a second register that receives one of the plurality of copies of the data unit from the egress port; and
a second rotator circuit having an input coupled to the second register and a plurality of outputs, the second rotator circuit outputting said one of the plurality of copies of the data unit on a selected one of the plurality of outputs of the second rotator circuit in accordance with a second rotation count, the first rotator circuit including first multiplexers and the second rotator including second multiplexers, the plurality of multiplexers not including the first multiplexers and second multiplexers.

2. The switch of claim 1, where each of the plurality of memories includes:
a one-read-one-write (1R1W) port memory.

3. The switch of claim 1, further including:
a plurality of write ports configured to receive a plurality of respective data units; and
a plurality of read ports configured to each receive data units from one of the plurality of multiplexers.

4. The switch of claim 3, where each of the plurality of write ports independently supplies the copies of the data units to the plurality of memories.

5. The memory device of claim 3, where each of the plurality of read ports independently receives the copies of the data units from the one of the plurality of multiplexers.

6. The switch of claim 1, where the read port includes:
read address lines to provide a read address to each of the plurality of memories in a group.

7. The switch of claim 6, where at least a portion of the read address lines for the read port are additionally provided to the corresponding one of the plurality of multiplexers.

8. The switch of claim 1, where the data unit includes a plurality of bits.

9. A storage device, comprising:
a first rotator circuit having a plurality of inputs and a plurality of outputs, the rotator circuit rotates a signal present on one of the plurality inputs among each of a plurality of outputs in accordance with a first rotation count;
a first register coupled to one of the plurality of outputs of the first rotator circuit;
a write port configured to receive a data unit from the first register;
a plurality of memories provided in groups, the write port supplies each of a plurality of copies of the data unit, such that said each of the plurality of copies of the data unit is written to a subset of the plurality of memories, each of the subset of the plurality of memories being provided in a corresponding one of the plurality of groups, a number of the copies of the data unit being greater than two;
a plurality of multiplexers, each of which being associated with a corresponding one of the groups of the memories, one of the plurality of multiplexers being configured to selectively supply one of the plurality of copies of the data unit from one of the plurality of memories; and
a read port configured to receive said one of the plurality of copies of the data unit from said one of the plurality of multiplexers and output said one of the plurality of copies of the data unit
a second register that receives said one of the plurality of copies of the data unit from the read port; and
a second rotator circuit having an input coupled to the second register and a plurality of outputs, the second rotator circuit outputting said one of the plurality of copies of the data unit on a selected one of the plurality of outputs of the second rotator circuit in accordance on a second rotation count, the first rotator circuit including first multiplexers and the second rotator including second multiplexers, the plurality of multiplexers not including the first multiplexers and second multiplexers.

10. The storage device of claim 9, where each of the plurality of memories includes:
a one-read-one-write (1R1W) port memory.

11. The storage device of claim 9, further including:
a plurality of write ports configured to receive a plurality of respective data units; and
a plurality of read ports configured to each receive data units from one of the plurality of multiplexers.

12. The storage device of claim 11, where each of the plurality of write ports independently writes data to the plurality of memories.

13. The storage device of claim 11, where each of the plurality of read ports independently reads data from the plurality of memories.

14. The storage device of claim 11, where the read port includes:
read address lines to provide a read address to each of the plurality of memories in a group.

15. The storage device of claim 14, where at least a portion of the read address lines for the read port are additionally provided to the corresponding one of the plurality of multiplexers.

16. A storage device comprising:
a first rotator circuit having a plurality of inputs and a plurality of outputs, the rotator circuit rotates a signal present on one of the plurality inputs among each of a plurality of outputs in accordance with a first rotation count;
a first register coupled to one of the plurality of outputs of the first rotator circuit;
a plurality of write ports each including an input data line and a write address line, at least one of the write ports being coupled to the first register;
a plurality of read ports each including an output data line and a read address line;
a second register coupled to the output data line;
a second rotator circuit having an input coupled to the second register and a plurality of outputs; and
a plurality of groups of memories, where the input data line and write address line for each of the plurality of write ports are connected to one of the memories in each of the plurality of groups of memories, and where the output data line and read address line for each of the plurality of read ports are connected to all of the memories in one of the plurality of groups of memories, the write port supplies each of a plurality of copies of a data unit, such that said each of the plurality of copies of the data unit is written to one memory in each of the plurality of groups of memories, the first rotator circuit including first multiplexers and the second rotator including second multiplexers.

17. The storage device of claim 16, further comprising:
a multiplexer, other than the first multiplexer and the second multiplexers, connected, at an input, to output data lines of all the memories in a group of the memories, and connected, at an output, to the plurality of output data lines of one of the read ports.

18. The storage device of claim 16, in which a quantity of write ports, read ports, and groups of memories are equal.

19. The storage device of claim 16, where the memory implements a non-blocking switch in which the data unit is readable from any of the plurality of read ports.

20. The storage device of claim 16, where each of the plurality of read ports independently reads data from the memory.

21. The storage device of claim 16, where each of the memories in the plurality of groups of memories are one-read-one-write (1R1W) port memories or two-read-two-write (2R2W) port memories.

* * * * *